United States Patent [19]

Matsumoto et al.

[11] 3,943,359
[45] Mar. 9, 1976

[54] APPARATUS FOR RELATIVELY POSITIONING A PLURALITY OF OBJECTS BY THE USE OF A SCANNING OPTOELECTRIC MICROSCOPE

[75] Inventors: Yoshio Matsumoto; Keiichi Okamoto, both of Yokohama, Japan

[73] Assignee: Hitachi, Ltd., Japan

[22] Filed: June 17, 1974

[21] Appl. No.: 480,242

[30] Foreign Application Priority Data
June 15, 1973 Japan.............................. 48-66880
June 15, 1973 Japan.............................. 48-66881

[52] U.S. Cl.............. 250/201; 250/237 R; 318/640; 356/152
[51] Int. Cl.².......................................... G01J 1/20
[58] Field of Search.................. 250/201, 237, 578; 356/138, 139, 152, 172; 318/640

[56] References Cited
UNITED STATES PATENTS

| | | | |
|---|---|---|---|
| 3,683,195 | 8/1972 | Johannsmeier | 250/237 X |
| 3,739,247 | 6/1973 | Yamaguchi et al. | 250/200 X |
| 3,744,914 | 7/1973 | Gonda | 250/233 X |
| 3,796,497 | 3/1974 | Mathisen et al. | 356/152 |
| 3,809,987 | 5/1974 | Suhr et al. | 250/201 X |

*Primary Examiner*—Archie R. Borchelt
*Assistant Examiner*—E. R. La Roche
*Attorney, Agent, or Firm*—Craig & Antonelli

[57] ABSTRACT

A positioning apparatus comprising marks for position detection which are respectively formed on a plurality of objects, means to cause optical images of the position detecting marks from the respective objects to reach a scanning mechanism, the scanning mechanism scanning the optical images at the same time, a plurality of detectors, each of which consists of a slit and a photoelectric element, the slits being arranged on an identical optical axis so that the optical images of the position detecting marks of the respective objects as scanned by the scanning mechanism may be detected respectively and individually, and a driving device which moves one of the plurality of objects on the basis of signals from the detectors, to effect the relative positioning of the plurality of objects.

10 Claims, 12 Drawing Figures

FIG. 1 PRIOR ART
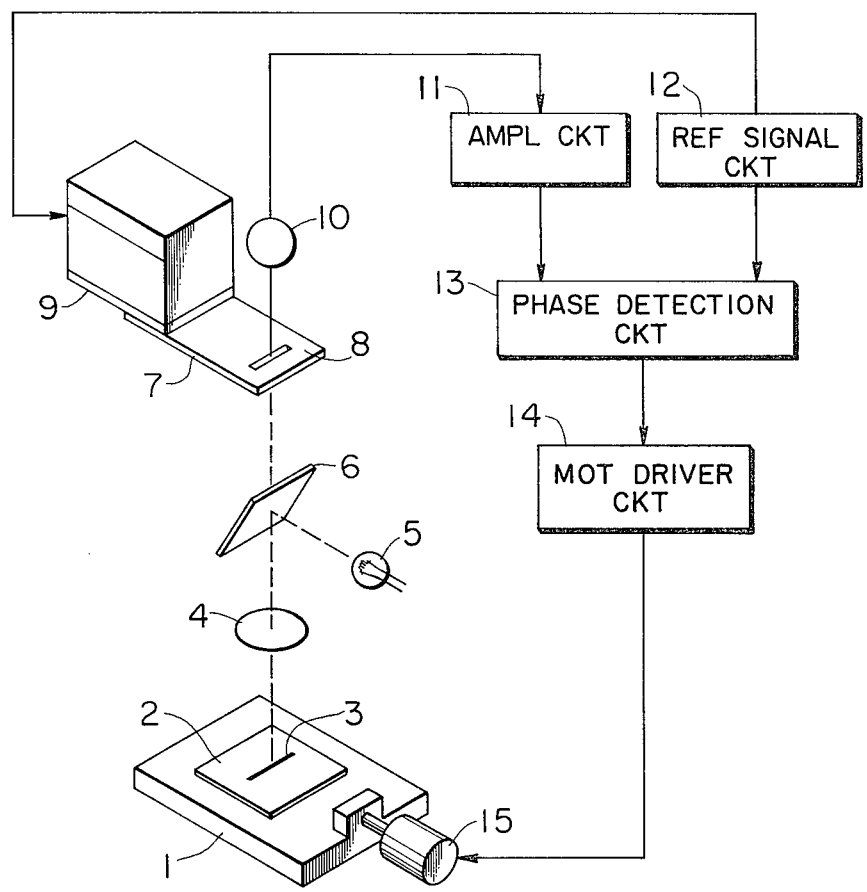
FIG. 2
FIG. 3
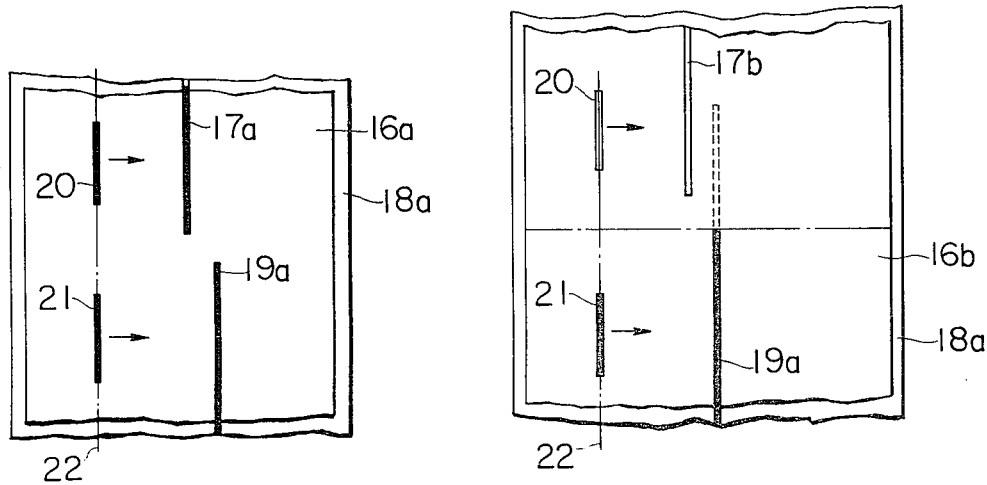

APPARATUS FOR RELATIVELY POSITIONING A PLURALITY OF OBJECTS BY THE USE OF A SCANNING OPTOELECTRIC MICROSCOPE

BACKGROUND OF THE INVENTION

1. Field of the Invention

The present invention relates to an apparatus for relatively positioning a plurality of objects, for example, minute precision components such as semiconductor elements, by the use of a scanning optoelectric microscope.

2. Description of the Prior Art

A prior art optoelectric microscope has been constructed so that a division of an object to be measured is positioned to a reference slit or the center of oscillation of a slit provided within the microscope. With reference to FIG. 1, description will be made of the prior art optoelectric microscope with which the division of an object to be measured is positioned to the center of oscillation of the slit provided within the microscope. Numeral 1 designates a stand for an object to be measured, 2 the object to be measured, 3 a mark for the position detection as provided on the object to be measured, 4 an objective lens, 5 a source of light, and 6 a half mirror. A slit plate 7 is mounted on a vibrator 9, and is provided with a slit 8 at one end. Shown at 10 is a photoelectric element, which detects a reflected light image from the object to be measured 2 through the medium of the slit 8 and which outputs the detected image in the form of an electric signal. An amplifier circuit 11 amplifies the signal from the photoelectric element 10, and delivers its output signal to a phase detection circuit 13. Numeral 12 indicates a reference signal generator, which outputs a reference signal to the phase detection circuit 13 and the vibrator 9. The phase detection circuit 13 outputs to a motor driver circuit 14 a signal of the phase difference between the signal from the amplifier circuit 11 and the signal from the reference signal generator 12. A driving motor 15 moves the stand 1 for the object to be measured. The amount of drive of the motor 15 is controlled on the basis of an output signal from the motor driver circuit 14.

With the foregoing construction, light given out by the light source 5 impinges upon the position detecting mark 3 on the object to be measured 2, and is turned into reflected light on the position detecting mark 3. The reflected light leads to the slit 8 through the objective lens 4 and the half mirror 6. The vibrator 9 vibrates the slit plate 7 in synchronism with the reference signal from the reference signal generator 12. A change in the quantity of light of a light flux passing through the slit 8 provided in the slit plate 7 is detected by the photoelectric element 10, and is converted into the electric signal. The detection signal converted into the electric signal is transmitted via the amplifier circuit 11 to the phase detection circuit 13, and is phase detected therein by the reference signal from the reference signal generator 12. At this time, where the position detecting mark 3 deviates from the center of oscillation of the slit 8, a D.C. signal is outputted from the phase detection circuit 13. It drives the stand 1 for the object to be measured via the motor driver circuit 14 and by the driving motor 15, so as to adjust the position detecting mark 3 to the center of oscillation of the slit 8.

In the case of performing the relative positioning of a plurality of objects by the use of the optoelectric microscope, the centers of oscillations of a plurality of slits provided within the optoelectric microscope are made references, and the position detecting marks on the respective objects are separately adjusted thereto. Therefore, the positioning accuracy lowers. A further disadvantage is that since a plurality of detecting systems and driving systems are required for each positioning in one direction, the apparatus becomes complicated.

SUMMARY OF THE INVENTION

It is an object of this invention to provide an apparatus in which accurate positioning of a plurality of objects can be carried out.

It is another object of this invention to provide an apparatus having rather simple mechanisms.

BRIEF DESCRIPTION OF THE DRAWINGS

The present invention will be explained in detail hereinbelow with reference to the accompanying drawings in which:

FIG. 1 is a diagram showing the construction of a prior art positioning apparatus in which a division of an object to be measured is positioned to the center of oscillation of a slit;

FIG. 2 is a diagram showing the relations for use in the present invention between slits and position detecting marks respectively formed on a plurality of objects;

FIG. 3 is a diagram showing the relations for use in the present invention between position detecting marks and slits as are different in form from FIG. 2;

DETAILED DESCRIPTION OF THE INVENTION

Figure 4:
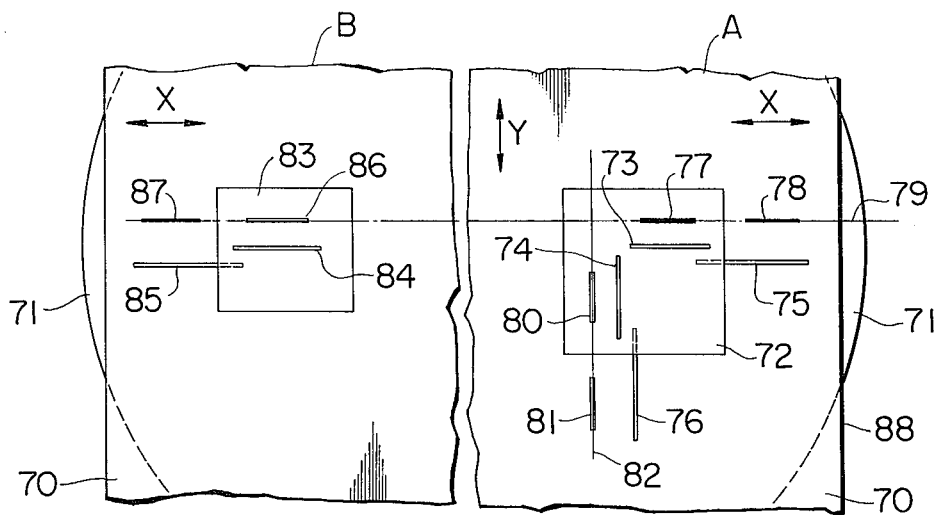
FIG. 4 is a diagram showing the relations according to the present invention between position detecting marks and slits as enable positioning in directions of two dimensions.

Referring to FIG. 2, description will be first made of position detecting marks formed on a plurality of objects as constitute the basic principle of the present invention and the relations of relative positions between the position detecting marks and slits confining the regions of optical images. Symbol 16a indicates a transparent object on one side to be positioned relatively, which object is formed with an opaque lineal mark 17a. Symbol 18a denotes an object on the other side for executing the relative positioning under the state under which it is placed on the object 16a. The object 18a is formed with a lineal mark 19a which differs in brightness from the surrounding part thereof, and which is arranged substantially in parallel with the lineal mark 17a. Slits 20 and 21 are provided on an identical optical axis 22 of a single optical system within a scanning microscope, and are arranged in the relations of positions respectively corresponding to the lineal mark 17a on the object 16a and the lineal mark 19a on the object 18a. Lying on the identical optical axis 22, they are scanned in the direction of arrows at the same time. Reflected light rays (optical images) from the objects having such position detection marks 17a and 19a proceed via the scanning microscope constructed of the single optical system, and pass through the slits 20 and 21 provided on the identical optical axis 22a. They are individually detected by means of photoelectric elements independent of each other. One of the two objects 16a and 18a is moved so that electric signals for the respective lineal marks 17a and 19a detected may coincide with each other in time. Thus, the relative positioning of the two objects is executed.

As will be stated hereunder, there is another form of position detecting marks. As illustrated in FIG. 3, an object on one side 16b has a half surface made transparent and the other half surface made opaque. The opaque half surface is provided with a lineal mark 17b. At the positioning, the object 18a for the relative positioning is placed on the object 16b, and the slits 20 and 21 lying on the identical optical axis 22 are simultaneously scanned in the direction of arrows. By thus detecting the respective lineal marks 17b and 19a, the relative positioning of both the objects 16b and 18a is carried out. Herein, since the opaque area exists in the object on one side 16b, it is avoided that one slit 20 detects also the lineal mark 19a of the object on the other side 18a. This brings about the merit that the allowable ranges in which both the objects 16b and 18a are positioned beforehand are expanded.

Figure 5:
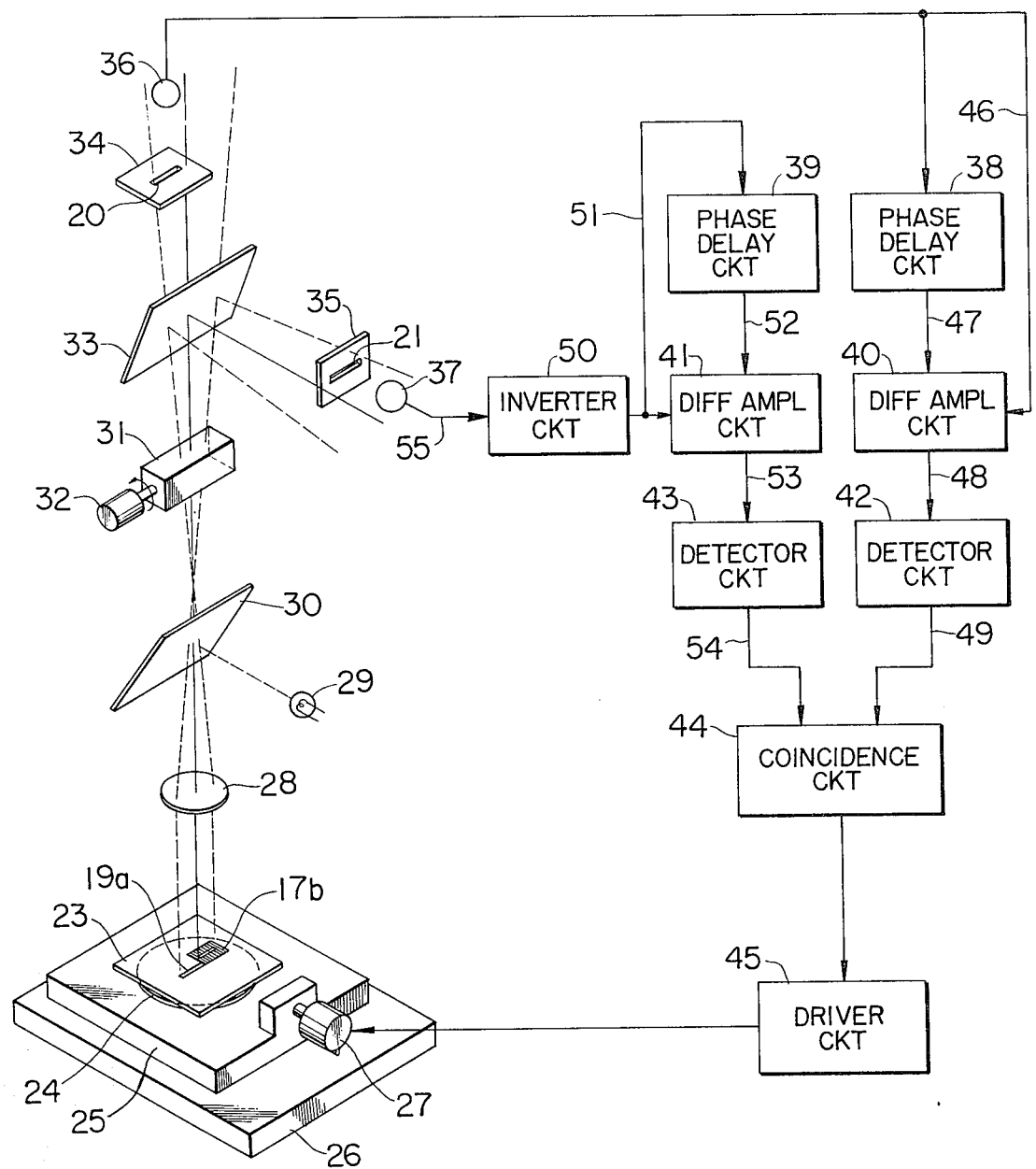
FIG. 5 is a constructional diagram of an apparatus for relatively positioning a plurality of objects by the use of a scanning optoelectric microscope, the apparatus being an embodiment of the present invention.

With reference to FIGS. 5 and 6, there will be described a case where an embodiment of the relative positioning of a plurality of objects according to the present invention is applied to the mask alignment of a semiconductor integrated circuit.

As shown in FIG. 5, a semiconductor wafer 24 which is formed with a lineal mark 19a of a brightness different from that of the surroundings is placed on a wafer carriage 25 in order to be positioned. The wafer carriage 25 is provided so as to be slidable on a foundation bed 26, and is slid in one direction by a driving motor 27. On the other hand, a mask (a photographic plate for photoresist) 23, which has a predetermined part made opaque and which is formed with a transparent lineal mark 17b in the opaque area, is placed on a supporting base (not shown) secured to the foundation bed 26.

As means to scan optical images of the lineal marks 17b and 19a, a scanning microscope is included. The scanning microscope is composed of an objective lens 28, a source of light 29, a half mirror 30, a parallel prism 31, and a motor 32 for rotating and driving the parallel prism 31. Further, means to detect the scanned optical images is included, and it is composed of a half mirror 33, a slit 20 provided in a slit plate 34, a slit 21 provided in a slit plate 35, a photoelectric element 36 for detecting the optical image having passed through the slit 20, and a photoelectric element 37 for detecting the optical image having passed through the slit 21. The slits 20 and 21 are arranged so as to lie on an identical optical axis (at 22 in FIG. 3).

A circuitry which, on the basis of signals from the device for detecting the optical images, drives the driving motor 27 for sliding the wafer carriage 25 is composed of phase delay circuits 38 and 39, differential amplifier circuits 40 and 41, zero intersection detector circuits 42 and 43, a coincidence circuit 44, and a driver circuit 45.

With the foregoing construction, light given out by the light source 29 impinges on the mask 23 and the wafer 24 through the half mirror 30 and the objective lens 28. The impinging light passes through the transparent area of the mask 23, gets onto the wafer 24 and is turned into reflected light on the wafer 24. Thus, the reflected light fluxes from the lineal mark 17b of the mask 23 and from the lineal mark 19a on the wafer 24 arrive at the parallel prism 31 through the objective lens 28 and the half mirror 30. At this time, the parallel prism 31 being rotated at a fixed speed by the motor 32 moves the light fluxes in parallel. The light fluxes moved in parallel are split into two beams by the half mirror 33. The beams pass through the respective slits 20 and 21, and get to the respective photoelectric elements 36 and 37. That is, in the beams split by the half mirror 33, the optical image of the lineal mark 17b of the mask 23 is singly passed through the slit 20 and detected by the photoelectric element 36, while the optical image of the lineal mark 19a on the wafer 24 is singly passed through the slit 21 and detected by the photoelectric element 37. When scanned, both the optical images change in the quantities of light passing through the respective slits 20 and 21. The optical images can be detected by the photoelectric elements 36 and 37. An output waveform from the photoelectric element 36 of the elements 36 and 37 is represented by a signal 46 shown in FIG. 6A. The phase delay circuit 38 bestows a suitable phase delay on the signal 46, and outputs a signal 47 shown in FIG. 6B. The differential amplifier circuit 40 amplifies the difference between the signals 46 and 47, and outputs a signal 48 shown in FIG. 6C. The zero intersection detector circuit 42 switches the signal 48 at an intersection point $E_0$ of zero voltage, and outputs a needle-shaped pulse signal 49 shown in FIG. 6D.

Figure 6A:
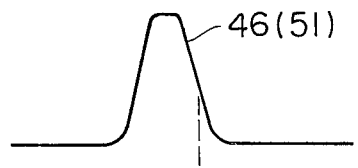
FIGS. 6A to 6D are diagrams showing the waveforms of signals outputted from various circuits of the apparatus in FIG. 5.
Figure 6B:
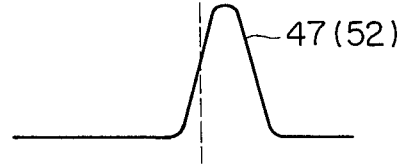
Figure 6C:
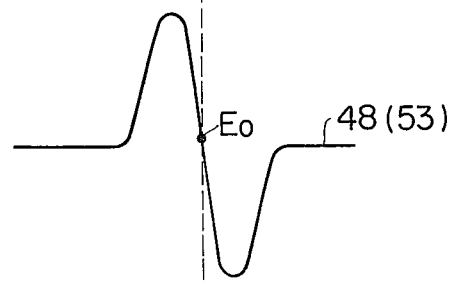
Figure 6D:

Likewise, since a signal 55 detected from the photoelectric element 37 in correspondence with the lineal mark 19a is a signal reverse to the signal 46 detected from the photoelectric element 36, it is inverted by an inverter circuit 50 to thus obtain a signal 51 having the same waveform as the output signal 46 shown in FIG. 6A. The phase delay circuit 39 delays the phase on the basis of the signal 51, and outputs a signal 52 of the waveform shown in FIG. 6B. The differential amplifier circuit 41 subjects the output signals 51 and 52 to the differential amplification, and outputs a signal 53 of the waveform shown in FIG. 6C. The zero intersection detector circuit 43 switches the signal 53 at the intersection point $E_0$ of zero voltage, and outputs a needle-shaped pulse signal 54 shown in FIG. 6D. Both the pulse signals 49 and 54 are fed to the coincidence circuit 44. When they deviate in time from each other, a "1" signal being positive or negative is outputted from the coincidence circuit 44, while when they are coincident in time with each other, a "0" signal is outputted. On the basis of the positive or negative "1" signal from the coincidence circuit 44, the driver circuit 45 determines the rotational direction of the driving motor 27 and rotates it. When the output from the coincidence circuit 44 becomes the "0" signal, the driver circuit stops the rotation of the driving motor. Thus, the wafer carriage 25 moves by a desired amount, and the lineal mark 19a on the wafer 24 is aligned with reference to the lineal mark 17b of the stationary mask 23.

Figure 7:
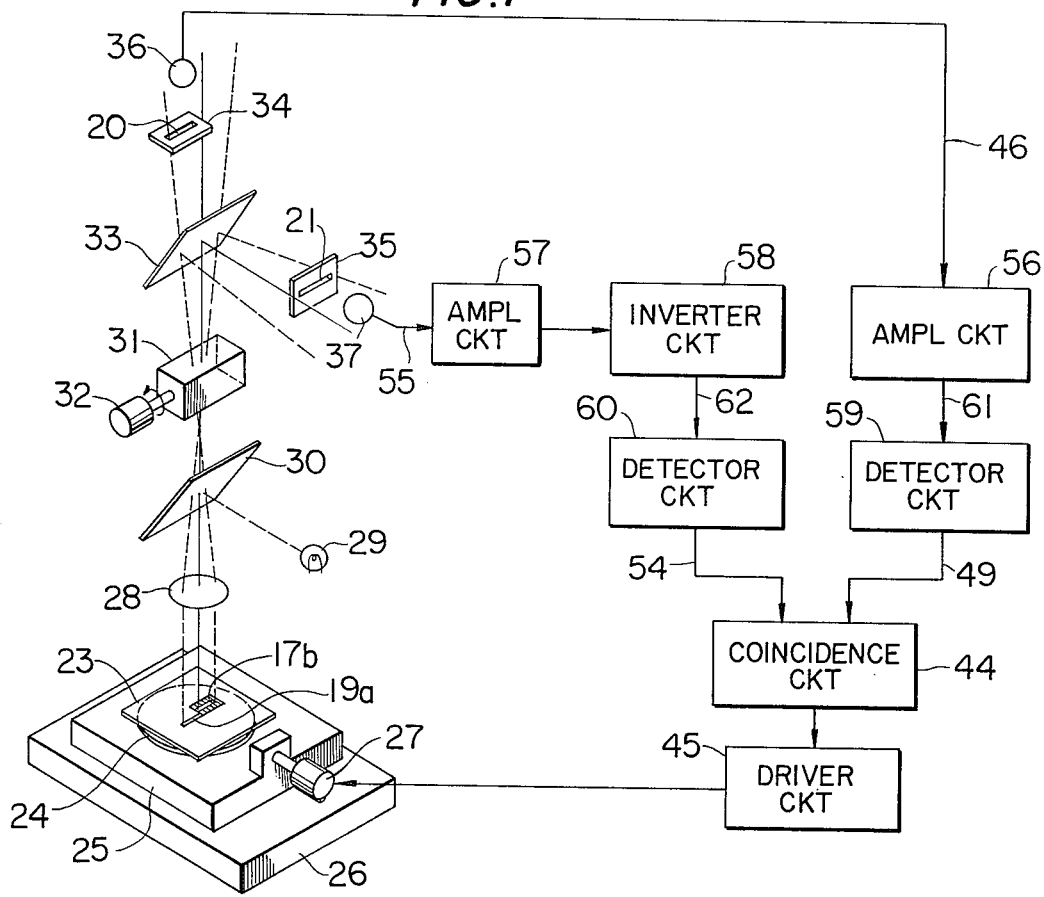
FIG. 7 is a diagram showing a modification of the circuit arrangement of the apparatus in FIG. 5.

Besides the circuit arrangement stated above, a circuit arrangement shown in FIG. 7 may be used. In the figure, numerals 56 and 57 indicate amplifier circuits which amplify the signals 46 and 55 from the respective photoelectric elements 36 and 37. Numeral 58 designates a circuit which inverts a signal from the amplifier circuit 57. Shown at 59 and 60 are peak detector circuits, which detect the peak values of a signal 61 from the amplifier circuit 56 and a signal 62 from the inverter circuit 58 and transmit the needleshaped pulse signals 49 and 54, respectively. The other parts of the circuit arrangement are the same as those shown in FIG. 5. With this measure, at the time when the lineal marks 17b and 19a are optically scanned and coincide with the centers of the slits 20 and 21 (on the optical axis 22), the needle-shaped pulse signals 49 and 54 are transmitted from the peak detector circuits 59 and 60, respectively. The needle-shaped pulse signals 49 and 54 are compared in time in the coincidence circuit 44, and the wafer carriage 25 with the wafer 24 placed thereon is moved until they coincide in time. As the result, the lineal mark 19a on the wafer 24 and the lineal mark 17b of the mask 23 are positioned on a straight line and aligned.

Although, in the foregoing embodiments, the slit plates 34 and 35 are arranged in two directions by the use of the half-mirror 33, this is not restrictive. The slit plates 34 and 35 may be arranged in close proximity on an identical plane if such arrangement is allowable in point of dimensions. Although the lineal mark 19a on the wafer 24 has been described as being formed of the dark portion, it is not restricted only to the dark portion. A bright portion is also possible if it differs in brightness from the surroundings.

While, in the foregoing embodiments, description has been made of the relative positioning in one direction, the actual positioning requires positionings in two axial directions and rotational directions. An embodiment in which the present invention is applied to the positioning in the two-dimensional directions will be explained hereunder with reference to the drawing. FIG. 4 is a diagram which illustrates the positional relations among position detecting marks formed on an object 70, position detecting marks formed on an object 71, and slits provided on identical optical axes in order to detect optical images of the respective position detecting marks. The flat object 70 and the flat object 71 to be positioned are superposed, and a portion A and a portion B are arranged at a suitable distance at both ends of the respective objects 70 and 71. At a part of the portion A of the object 70, there is formed an opaque portion 72, which is formed with transparent lineal marks 73 and 74 in X- and Y-directions orthogonal to each other. Further, in the portion A of the other object 71 superposed on the object 70 and for executing the relative positioning, lineal marks 75 and 76 differing in brightness from their surrounding parts are formed in the X- and Y-directions orthogonal to each other. Slits 77 and 78 for independently and separately detecting the lineal marks 73 and 75, respectively, are provided on an identical optical axis 79 (identical straight line) in the X-direction. Slits 80 and 81 for independently and separately detecting the lineal marks 74 and 76, respectively, are provided on an identical optical axis 82 (identical straight line) in the Y-direction. On the other hand, at a part of the portion B of the object 70, an opaque portion 83 is formed, in which a transparent lineal mark 84 is formed in the X-direction. Further, in the portion B of the other object 71 superposed on the object 70, a lineal mark 85 differing in brightness from its surrounding part is formed in the X-direction. Slits 86 and 87 for independently and separately detecting the lineal marks 84 and 85, respectively, are provided on the same optical axis 79 (identical straight line) as that of the slits 77 and 78.

With the foregoing construction, the object 70 is previously placed on a stationary frame (not shown) having a certain relation with a microscope so that a straight line coupling the lineal marks 73 and 84 formed on the object 70 may become substantially parallel to the optical axis 79 (straight line) of the slits 77 and 86 provided within the microscope and that it may be positioned substantially at the center of the scanning ranges of the slits 77 and 86. Since the previous positioning is not strict, a reference end face 88 of the object 70 may be mechanically brought into coincidence with a reference face of the stationary frame (not shown) disposed in predetermined relations with the slits 77 and 86. Subsequently, the object 71 is arranged under the object 70, and the slits 77, 78, 86, and 87 are scanned in the Y-direction at the same time. At this time, the quantities of light passing through the slits 77 and 78 are detected by means of photoelectric elements and pulse shaping circuits connected thereto, so that the positional deviation between the lineal marks 73 and 75 is detected in the form of a period of time ± $Ta$ between respective pulse signals outputted from the pulse shaping circuits. Simultaneously therewith, the quantities of light passing through the slits 86 and 87 are detected by means of photoelectric elements and pulse shaping circuits connected thereto, so that the positional deviation between the lineal marks 84 and 85 is detected in the form of a period of time ± $Tb$ between respective pulse signals outputted from the pulse shaping circuits. Until the periods of time ± $Ta$ and ± $Tb$ become coincident also in sign, the object 71 is rotated. Thereafter, until the period of time ± $Ta$ or ± $Tb$ becomes zero, the object 71 is moved in the Y-direction. Subsequently, the slits 80 and 81 are scanned in the X-direction, and the positional deviation between the lineal marks 74 and 76 is detected by means of photoelectric elements located behind the slits 80 and 81 and pulse signal generator circuits connected to the photoelectric elements. Until the period of time between respective pulse signals outputted from the pulse signal generator circuits becomes zero, that is, until the respective pulse signals become coincident in time, the object 71 is moved in the X-direction. Thus, the relative positionings between the objects 70 and 71 in the X-direction, the Y-direction and the rotational direction are completed.

Figure 9:
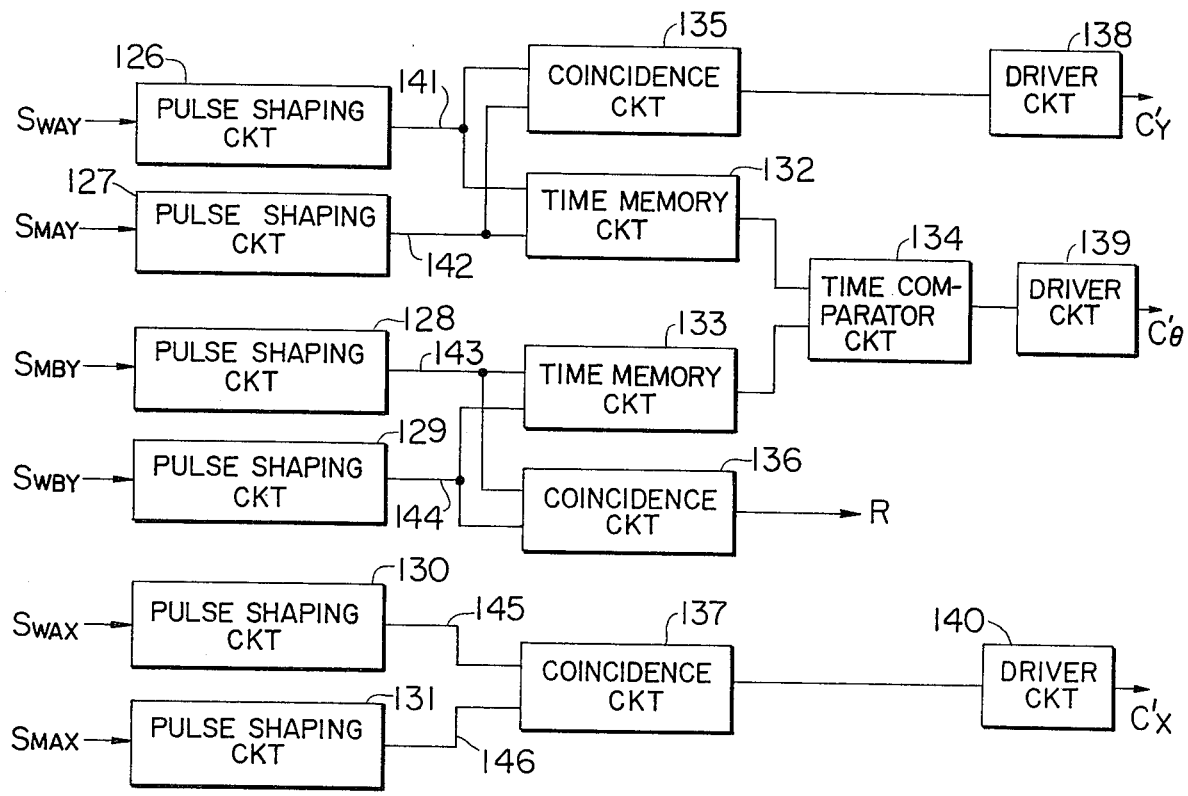
FIG. 9 is a block diagram of circuits employed in the relative positioning apparatus in FIG. 8.
Figure 8:
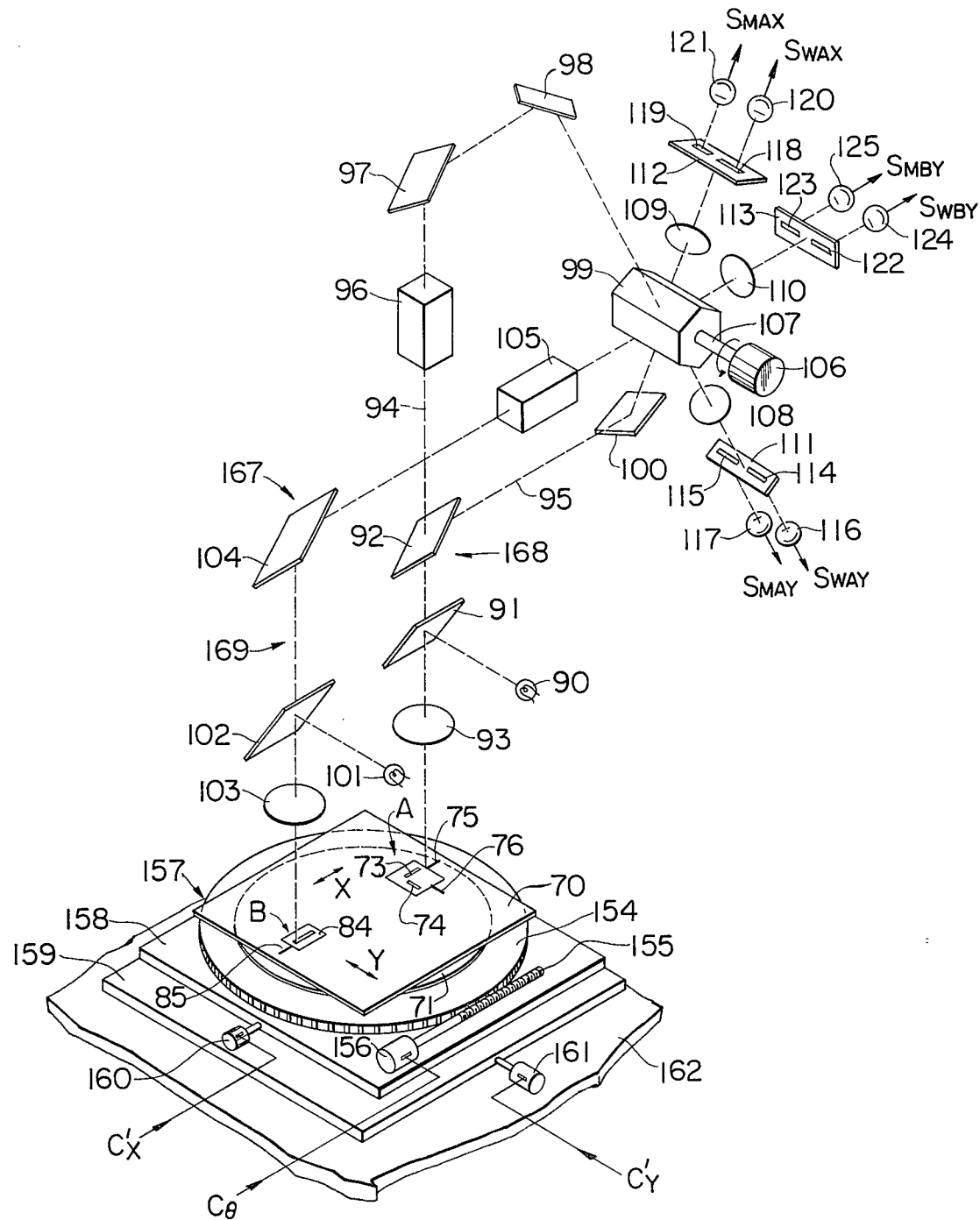
FIG. 8 is a constructional diagram showing an embodiment of an apparatus according to the present invention for relatively positioning a plurality of objects in two dimensions by the use of a scanning optoelectric microscope.

Referring to FIGS. 8 and 9, description will be made of an embodiment of a positioning apparatus in the case where the two-dimensional relative positioning according to the present invention is applied to a mask alignment in the manufacture of semiconductor elements. A wafer 71 is formed with lineal marks 75, 76, and 85 different brightness from their surrounding parts in the positional relations illustrated in FIG. 4. Further, the wafer 71 is placed on a rotatable supporting base 154. A toothed wheel is provided at the periphery of the supporting base 154. A gearing 155 which consists of the toothed wheel and a worm meshing therewith is coupled with a driving device 156. The supporting base 154 includes parts of a positioning device 157. The positioning device 157 is further provided with tables 158 nd 159 which are slidable in a manner to cross each other. The tables 158 and 159 are slid in the X- and Y-directions by driving devices 160 and 161, respectively. The positioning device 157 is mounted on a bed 162. A stationary frame (not shown) attached to the bed 162 has both ends of a mask 70 placed thereon, and it is provided with a reference face (not shown) for mechanically placing the mask 70 at a predetermined position. The mask 70 is formed with transparent lineal marks 73, 74, and 84 in an opaque portion in the positional relations illustrated in FIG. 4. An optical device 167 for detecting the lineal marks is mounted on the bed 162. The optical device 167 is divided into the first optical system 168 for detecting the optical image of the portion A formed of the lineal marks 75, 76, 73 and 74, and the second optical system 169 for detecting the optical image of the portion B formed of the lineal marks 85 and 84. The first optical system 168 includes a light source 90 as well as a half mirror 91 for illuminating the portion A, and a collimator lens 93 for causing a reflecting image from the portion A to reach a half mirror 92. The half mirror 92 transmits and reflects the optical image of the portion A along optical paths 94 and 95 as the first and second optical images, respectively. Arranged within the optical path 94 of the first optical image is an image rotating prism 96. The first optical image passing through the image rotating prism 96 is rotated by 90 degrees within a plane normal to the optical axis. The first optical image rotated arrives through reflectors 97 and 98 at a parallel prism 99 being a scanning mechanism. On the other side, the parallel prism 99 receives the second optical image, not rotated, through a reflector 100 provided in the optical path 95. Further, light given out from a light source 101 is caused to impinge on the portion B by a half mirror 102 and the third optical image reflected from the portion B gets to a reflector 104 owing to a collimator lens 103. The third optical image is rotated by 90 degrees within a plane normal to the optical axis by means of an image rotating prism 105, and reaches the parallel prism 99. The parallel prism 99 is a columnar prism having several pairs of opposing parallel planes, and is rotated at a predetermined speed about an axis 107 by a motor 106. The first, second and third optical images having reached the surface of the parallel prism 99 permeate through the interior of the parallel prism 99, are focused by oculars 108, 109 and 110, and scan on the planes of scanning plates 111, 112 and 113, respectively. The scanning plate 111 is provided with slits 114 and 115 which are perforated on a straight line likewise to the slits 77 and 78 in the positional relation illustrated in FIG. 4. Photoelectric elements 116 and 117 are provided behind the slits 114 and 115, respectively. The scanning plate 112 is provided with slits 118 and 119 which are perforated on a straight line likewise to the slits 80 and 81 in the positional relation illustrated in FIG. 4. Photoelectric elements 120 and 121 are provided behind the slits 118 and 119, respectively. In the scanning plate 113, slits 122 and 123 which have the same optical axis as that of the slits 114 and 115 (this means that the slits are arranged on an identical axis optically) and which are perforated on a straight line are provided likewise to the slits 86 and 87 in the positional relation illustrated in FIG. 4. Photoelectric elements 124 and 125 are provided behind the slits 122 and 123, respectively. Thus, in the first optical image having scanned on the scanning plate 111, the optical image of the lineal mark 75 on the wafer 71 passes through the slit 114 and is detected by the photoelectric element 116, to produce an electric signal $S_{WAY}$. In the first optical image, the optical image of the lineal mark 73 of the mask 70 passes through the slit 115 and is detected by the photoelectric element 117, to produce an electric signal $S_{MAY}$. Similarly, in the second optical image having scanned on the scanning plate 112, the optical image of the lineal mark 76 on the wafer 71 passes through the slit 118 and is detected by the photoelectric element 120, to produce an electric signal $S_{WAX}$. In the second optical image, the optical image of the lineal mark 74 of the mask 70 passes through the slit 119 and is detected by the photoelectric element 121, to produce an electric signal $S_{MAX}$. Further, in the third optical image having scanned on the scanning plate 113, the optical image of the lineal mark 85 on the wafer 71 passes through the slit 122 and is detected by the photoelectric element 124, to produce an electric signal $S_{WBY}$. In the third optical image, the optical image of the lineal mark 84 of the mask 70 passes through the slit 123 and is detected by the photoelectric element 125, to produce an electric signal $S_{MBY}$.

The electric signal $S_{WAY}$ outputted from the photoelectric element 116 is converted by a pulse shaping circuit 126 into a needle-shaped pulse signal 141 corresponding to the lineal mark 75, and the pulse signal is inputted to a time memory circuit 132 and a coincidence circuit 135. The electric signal $S_{MAY}$ outputted from the photoelectric element 117 is coverted by a pulse shaping circuit 127 into a needle-shaped pulse signal 142 corresponding to the lineal mark 73, and the pulse signal is inputted in the time memory circuit 132 and the coincidence circuit 135. Likewise, the electric signal $S_{MBY}$ outputted from the photoelectric element 125 is converted by a pulse shaping circuit 128 into a needle-shaped pulse signal 143 corresponding to the lineal mark 84, and the pulse signal is inputted to a time memory circuit 133 and a coincidence circuit 136. The electric signal $S_{WBY}$ outputted from the photoelectric element 124 is converted by a pulse shaping circuit 129 into a needle-shaped pulse signal 144 corresponding to the lineal mark 85, and the pulse signal is inputted to the time memory circuit 133 and the coincidence circuit 136. Thus, the time memory circuit 132 sequentially records the period $\pm Ta$ from the time at which the pulse signal 142 is outputted to the time at which the pulse signal 141 is outputted, with reference to the pulse signal 142. Similarly, the time memory circuit 133 sequentially records the period $\pm Tb$ from the time at which the pulse signal 143 is outputted to the time at which the pulse signal 144 is outputted, with reference to the pulse signal 143. A time comparator circuit 134 sequentially makes comparisons between the period of time $\pm Ta$ sequentially outputted from the time memory circuit 132 and the period of time $\pm Tb$ sequentially outputted from the time memory circuit 133. Until the periods of time become coincident in both the magnitude and the sign, the comparator circuit 134 holds a driver 139 operative to feed a control signal $C'\theta$ to the driving device 156. The supporting base 154 is accordingly kept rotating, to effect the parallelling between the lineal marks 73, 84 of the mask 70 and the lineal marks 75, 85 of the wafer 71 with reference to the lineal marks 73, 84 of the mask 70.

Until the pulse the pulse 141 from the pulse shaping circuit 126 and the pulse signal 142 from the pulse shaping circuit 127 become coincident in time, the coincidence circuit 135 holds a driver 138 operative to feed a control signal $C'_Y$ to the driving device 161 and to move the table 159 in the Y-direction. Thus, the relative positioning in the Y-direction between the mask 70 and the wafer 71 is completed. At this time, if the pulse signals 143 and 144 inputted to the coincidence circuit 136 are not coincident in time, the coincidence circuit 136 will output an alarm signal R to readjust the optical system or electric system of the positioning apparatus.

Further, the electric signal $S_{WAX}$ outputted from the photoelectric element 120 is converted by a pulse shaping circuit 130 into a needle-shaped pulse signal 145 corresponding to the lineal mark 76, which is inputted to a coincidence circuit 137. The electric signal $S_{MAX}$ outputted from the photoelectric element 121 is converted by a pulse shaping circuit 131 into a needle-shaped pulse signal 146 corresponding to the lineal mark 74, which is inputted to the coincidence circuit 137. Until the pulse signals 145 and 146 become coincident, the coincidence circuit 137 holds a driver 140 operative to feed a control signal $C'_X$ to the driving device 160 and to move the table 158 in the X-direction. Thus, the relative positioning in the X-direction between the mask 70 and the wafer 71 is completed. In this way, the alignment between the mask 70 and the wafer 71 is fully completed.

As explained above, according to the present invention, the relative positioning apparatus is provided with marks for position detection which are respectively formed on a plurality of objects, slits which are the same number as that of the position detecting marks and which are provided on an identical optical axis of a single optical system, photoelectric elements which are respectively provided behind the slits and which detect optical images of the position detecting marks, respectively, converter circuits which convert signals from the photoelectric elements into pulse signals corresponding to the respective position detecting marks, and driving means to keep moving one of the plurality of objects until the signals from the respective converter circuits become coincident, so that the relative positioning accuracy of a plurality of objects is remarkably enhanced in comparison with that of the prior art apparatus. Furthermore, according to the present invention, a device for generating a reference signal for positioning the objects need not be provided within a scanning optoelectric microscope, so that the apparatus of the present invention for relatively positioning a plurality of objects by the use of a scanning optoelectric microscope can be made simple in construction.

What is claimed is:

1. An apparatus for relatively positioning two objects each having marks for position detection formed thereon at least at two spaced regions of the respective objects, comprising optical means for detecting said marks on said objects including at least first and second optical system means for dividing a reflecting optical image from said marks into first, second, and third optical images, a parallel prism for scanning and permeating said first, second, and third optical images, scanning plates each having a pair of slits therein and being arranged behind said parallel prism on a respective optical axis of said optical means to intercept a respective one of said optical images, photoelectric detecting means positioned behind each of said scanning plates to detect said optical images of said position detection marks, respectively, converter means for converting the output of said photoelectric detecting means into pulse signals, driving means for moving one of said objects, and coincidence means for operating said driving means until the signals from said converter means become coincident.

2. An apparatus as defined in claim 1, wherein said optical means includes at least one light source and means for directing light from said light source to said position detecting marks on said objects.

3. An apparatus as defined in claim 2, wherein said scanning plates are positioned so that the pair of slits therein each scan a corresponding position detection mark on the pair of objects.

4. An apparatus as defined in claim 3, wherein one of said objects is disposed to cover at least a portion of the other object, the one object being opaque in the area of the position detection marks thereon which are provided as transparent areas.

5. An apparatus as defined in claim 4, wherein said objects each are provided with two lineal orthogonally disposed position detection marks in a first corresponding area and at least one lineal position detection mark in a second corresponding area.

6. An apparatus as defined in claim 5, wherein said first optical system is disposed to detect the marks at said first area of said objects and comprises a half mirror which divides the optical image of said first area into said first and second optical images and an image rotating prism positioned to rotate one of said first and second optical images.

7. An apparatus as defined in claim 6, wherein said second optical system is disposed to detect the marks at said second area of said objects.

8. An apparatus as defined in claim 7, wherein said photoelectric detecting means includes a photoelectric detector positioned behind each slit in said scanning plates.

9. An apparatus as defined in claim 8, wherein said coincidence means comprises a plurality of coincidence circuits each receiving at the inputs thereof the outputs of the photoelectric detectors associated with a respective scanning plate.

10. An apparatus as defined in claim 9, wherein said driving means comprises first, second, and third driving devices for moving one object in orthogonal directions and in rotation, respectively, each driving element being connected to the output of a respective coincidence circuit.

* * * * *